United States Patent
Bangert

(10) Patent No.: US 6,894,921 B2
(45) Date of Patent: May 17, 2005

(54) STANDARD CELL ARRANGEMENT FOR A MAGNETO-RESISTIVE COMPONENT

(75) Inventor: Joachim Bangert, Erlangen (DE)

(73) Assignee: SIEMENS Aktiengesellschaft, Munich (DE)

( * ) Notice: Subject to any disclaimer, the term of this patent is extended or adjusted under 35 U.S.C. 154(b) by 0 days.

(21) Appl. No.: 10/488,995

(22) PCT Filed: Aug. 28, 2002

(86) PCT No.: PCT/DE02/03146
§ 371 (c)(1),
(2), (4) Date: Mar. 10, 2004

(87) PCT Pub. No.: WO03/026131
PCT Pub. Date: Mar. 27, 2003

(65) Prior Publication Data
US 2004/0240258 A1 Dec. 2, 2004

(30) Foreign Application Priority Data
Sep. 10, 2001 (DE) .......................... 101 44 385

(51) Int. Cl.$^7$ .............................................. G11C 11/00
(52) U.S. Cl. ................... 365/158; 365/232; 365/189.08
(58) Field of Search ................................ 365/158, 232, 365/189.08, 173, 171, 51

(56) References Cited

U.S. PATENT DOCUMENTS 5,629,549 A    5/1997 Johnson
6,034,887 A    3/2000 Gupta et al.
6,423,553 B1 * 7/2002 Johnson .......................... 438/3
6,490,190 B1 * 12/2002 Ramcke et al. ............. 365/158

FOREIGN PATENT DOCUMENTS

DE      100 53 206      1/2002
WO      WO 02/35704 A1  5/2002

OTHER PUBLICATIONS

Shen, Jun: "Logic Devices and Circuits Based on Giant Magnetoresistance", IEEE Transactions on Magnetics, vol. 33, No. 6, Nov. 1997, pp. 4492–4497, XP000831058.
Patent Abstracts of Japan, "Integrated Magnetic Sensor", Appln. No. 57–115216, Jan. 13, 1984.
S. Bae et al.: Magnetoelectronic Devices Using a–Fe2O3 Bottom GMR Spin–Valves, IEEE Transactions on Magnetics, vol. 37, No. 4, Jul. 2001.

* cited by examiner

Primary Examiner—Van Thu Nguyen
Assistant Examiner—Dang Nguyen
(74) Attorney, Agent, or Firm—Young & Thompson

(57) ABSTRACT

A standard cell arrangement for a magneto-resistive component, comprising at least one magneto-resistive layer system, preferably in the center of the cell, in addition to at least one input and at least one output on the cell periphery. The input is provided with two input connections which can be connected to each other in order to conduct a current producing a magnetic field used to influence the magneto-resistive layer system. The output has two output connections which can be connected to the magneto-resistive layer system to pick off a signal. The input and output connections are arranged at predetermined points in relation to a rectangular basic shape of said cell (respectively mirror-symmetrical or point-symmetrical to the center of the cell).

16 Claims, 3 Drawing Sheets

STANDARD CELL ARRANGEMENT FOR A MAGNETO-RESISTIVE COMPONENT

CROSS REFERENCE TO RELATED APPLICATIONS

This is the 35 USC 371 national stage of international application PCT/DE02/03146 filed on Aug. 28, 2002, which designated the United States of America.

FIELD OF THE INVENTION

The invention relates to a standard cell arrangement for a magnetoresistive component, in particular a logic component.

BACKGROUND OF THE INVENTION

A magnetoresistive component comprising at least one magnetoresistive layer system with the associated inputs and outputs has hitherto been planned individually, that is to say the component has an individual architecture. In this case, the circuit layout (wiring, positioning) is usually designed manually or using self-created layout software. Since magnetoresistive components are increasingly gaining in importance, such a procedure for the configuration of the layout or the architecture is not expedient.

SUMMARY OF THE INVENTION

In this case, the invention is based on the problem of specifying a possibility for simplifying the layout of a magnetoresistive component.

In order to solve this problem, the invention provides a standard cell arrangement for a magnetoresistive component, comprising at least one magnetoresistive layer system preferably in the cell center and also at least one input and at least one output at the cell periphery, which are logical inputs and outputs in the case of a logic module, the input having two input terminals, which can be connected to one another for the purpose of carrying a current which generates a magnetic field serving to influence the magnetoresistive layer system, the output having two output terminals, which can be connected to the magnetoresistive layer system for the purpose of tapping off a signal, and the input and output terminals being arranged at predetermined grid of the cell in each case mirror-symmetrically with respect to one another or centrosymmetrically with respect to the cell center.

The invention proposes a standardized cell configuration, this standard cell having at least one magnetoresistive layer system expediently, but not necessarily, in the cell center and also corresponding inputs and outputs, of which in each case at least one is provided. The input and output terminals are in each case arranged at defined grid dimension points relative to a rectangular cell basic form or a defined rectangular base area of the standard cell. In this case, said grid dimension points and the symmetry are chosen such that, in the case of an arrangement of two standard cells one next to the other or one above the other, the respective terminals of the two standard cells which are to be connected to one another are automatically directly opposite one another, which simplifies the routing of the connecting lines. Moreover, it is possible, of course, on account of the standardization of the cell arrangement, to integrate such a standard cell configuration as standard into a layout program, which altogether actually enables the creation of the circuit layout and also the component architecture.

Two input and two output terminals should be arranged in each case at mutually opposite sides at the cell periphery.

According to the invention, the two input and two output terminals should be arranged in each case directly opposite one another at the respective sides. In this case, the two output terminals and/or the two input terminals are expediently provided in the center of the respective side of the rectangular basic form of the cell.

As an alternative to an arrangement having only one input or logical input, according to the invention it may furthermore be provided that provision is made of two inputs each having two input terminals, in each case two input terminals being arranged at a side of the rectangular basic form symmetrically with respect to the respective side center. The symmetry according to the invention and also the compliance or the arrangement in a predetermined grid dimension are also afforded in the case of, by way of example, a total of four input terminals.

The magnetoresistive layer system itself has, corresponding to the number of output terminals provided at the cell periphery, dedicated system output terminals and, corresponding to the number of input terminals provided at the cell periphery, dedicated system input terminals, which can be connected to the peripheral output and input terminals via connecting interconnects. In this case, the connecting lines are routed into different planes by means of suitable technology, which is sufficiently known. In order to simplify the line routing and in order to be able to ensure the shortest possible connecting paths, it is expedient if the terminals that are in each case to be connected to one another are directly opposite one another.

In a development of the concept of the invention, it may be provided that provision is made of a plurality of symmetrically constructed cells for forming an enlarged standard cell arrangement with an area of the magnitude '1' which corresponds to an integer multiple of the area of the rectangular basic form of the single cell. In the case of this refinement of the invention, the invention proposes not only defining a single standard cell but also enlarged standard cell arrangements corresponding to a multiple of a single cell, that is to say for example to double or triple the latter, a corresponding number of magnetic layer systems and also inputs and outputs then also being provided here. The corresponding dimensioning of the magnitude of this enlarged standard cell arrangement relative to a multiple of the basic area of a single cell and also the grid dimension arrangement of the peripheral input and output terminals makes it possible e.g. to position beside an enlarged standard cell arrangement with two magnetoresistive layer systems and corresponding outputs and inputs two single standard cell arrangements which, on the one hand, are then automatically positioned correctly with regard to the respective terminals of the enlarged standard cell arrangement and, on the other hand, in this way use is optimally made of the existing space available for compacting the circuit layout, since the size of the two single standard cell arrangements corresponds to the greatest possible extent to that of the enlarged standard cell arrangement.

The construction of the standard cell arrangement is expediently described in the form of program code means which are part of a computer program for creating the layout of an electronic magnetoresistive component.

In addition to the standard cell arrangement itself, the invention furthermore relates to an electronic magnetoresistive component, comprising at least one standard cell arrangement of the prescribed type, the peripheral input and output terminals of which are connected to system input and system output terminals on the layer system side via connecting interconnects or current-carrying connecting means.

The connecting interconnects run essentially horizontally and essentially vertically and cross one another at an angle of 90°, the interconnects, as already described, running in different planes, this being necessary for insulation reasons. The routing of the interconnects into the corresponding planes is effected, as is known, via suitable contact holes provided at the respective input, output, system input and system output terminals. In addition, the terminals may be connected via a suitable current-carrying connecting means. The arrangement of an amplification transistor, of a programmable path transistor or of a diode or generally of an active or passive or linear or nonlinear element is conceivable.

The magnetoresistive layer system for a standard cell having the area requirement of '1' is typically an OR gate, an AND gate, a NOR gate or a NAND gate, for which purpose, on the one hand, two logical inputs are provided and the definition as an OR gate or as a NOR gate or as an AND gate or as a NAND gate is effected, by way of example, by means of the corresponding interconnect routing and the geometry or composition of the magnetoresistive component.

The layer system itself is of the GMR (giant magnetoresistive), TMR (tunnel magnetoresistive), AMR (anisotropy magnetoresistive) or CMR (colossal magnetoresistive) type. An essential characteristic of the layer system is a hysteresis behavior and that switching with currents is possible.

BRIEF DESCRIPTION OF THE DRAWINGS

Further advantages, features and details of the invention emerge from the exemplary embodiments described below and also with reference to the drawings, in which.

DESCRIPTION OF THE PREFERRED EMBODIMENTS

Figure 1:
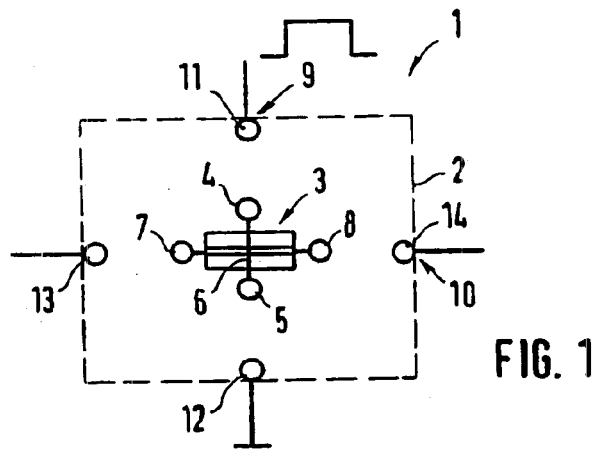
FIG. 1 shows a standard cell arrangement as a single cell with an input and an output in a crossing arrangement.

FIG. 1 shows a standard cell arrangement 1 of a first embodiment in the form of a schematic sketch. The standard cell arrangement has an essentially rectangular basic form 2, as is indicated by the dashed line. Furthermore, a magnetoresistive layer system 3, which is only represented in principle here, is provided in the cell center. The layer system may be a GMR system (giant magnetoresistive), TMR system (tunnel magnetoresistive), AMR system (anisotropy magnetoresistive) or a CMR system (colossal magnetoresistive). The layer system 3 or assigned to the latter are system input terminals 4, 5, which are connected to one another via an interconnect 6. A current is carried via said terminals 4, 5 or the interconnect 6 during operation, which current generates a magnetic field which acts on the magnetoresistive layer system 3 and, depending on the design thereof, if appropriate brings about magnetization reversal effects. The basic principle of such a magnetoresistive layer system is sufficiently known; it does not need to be discussed in any more detail.

Furthermore, two system output terminals 7, 8 are provided at the layer system 3, it being possible to tap off via said system output terminals a signal whose magnitude is dependent on the magnetization state of the layer system 3. Said magnetization state depends on a basic magnetization of the layer system, which is set in particular by impressing a magnetization with a predetermined direction into a magnetically relatively hard layer (also referred to as reference or bias layer) of the system.

Furthermore, an input 9 and also an output 10 are provided at the cell periphery, which is represented by the rectangular basic form 2 or the dashed line shown here. The input 9 comprises two peripheral input terminals 11, 12 positioned in the center of the respective side of the rectangular basic form 2. Since the layer system 3 is also expediently arranged centrally and, consequently, so are the system input terminals 4, 5, it clearly emerges that, on account of this grid dimension arrangement at the defined points, the input terminal 9 is directly opposite the system input terminal 4 and the system input terminal 5 is directly opposite the input terminal 12. The standard cell shown is constructed mirror-symmetrically, that is to say that in the event of mirroring about the horizontal or vertical, the terminals that are opposite one another at the respective sides are imaged one on the other. A configuration with a centrosymmetry with respect to the cell center would also be conceivable in addition to a mirror symmetry. In such a case, two terminals would not have to be opposite one another, but rather would have to lie on a common connecting straight line through the cell center and at the same distance therefrom. It is important for one of the symmetries mentioned to be provided, in order to ensure, in the case of an arrangement of two standard cells one next to the other, that the relevant terminals are adjacent.

The same applies correspondingly to the output terminals 13, 14 forming the output 10. These are likewise positioned in the center of the respective side of the basic form and are likewise directly opposite the system output terminals 7, 8.

Figures 2, 3:
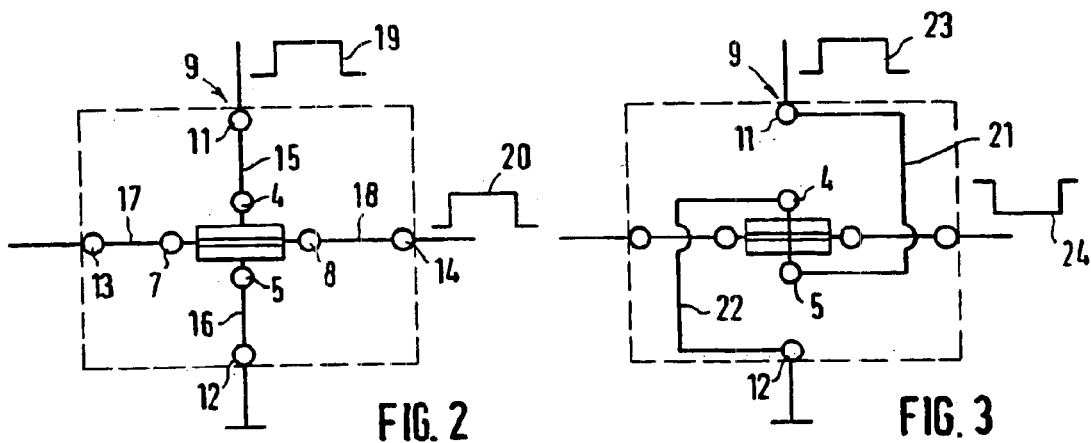
FIG. 2 shows a circuit layout of the standard cell from FIG. 1 of a first embodiment.
FIG. 3 shows a circuit layout of the standard cell from FIG. 1 of a second embodiment, in which the interconnect routing has been varied.

This simple standard cell arrangement of the first embodiment described in FIG. 1 can now be connected up in various ways, this being effected by the routing of connecting interconnects between the respective input and output terminals and also the system input and system output terminals. FIG. 2 shows a first circuit layout for a noninverting component. The input and system input terminals 11, 4, 5, 12 are directly connected to one another via connecting interconnects 15, 16.

The same applies correspondingly to the output and system output terminals 13, 7, 8, 14, which are directly connected to one another via connecting interconnects 17, 18. A current pulse 19 present at the logical input 9 forms the input signal. The output signal 20 is in phase with the input signal for this noninverting component.

By contrast, FIG. 3 shows a circuit layout for a signal inverter. Here, the input terminal 11 is connected to the system input terminal 5 and the system input terminal 4 is connected to the input terminal 12, that is to say that two conductor loops 21, 22 are laid. The output and system output terminals are directly connected to one another, as described with reference to FIG. 2. On account of the magnetic properties and also the switching behavior of the layer system 3, the output signal 24 is inverted on account of the reversed current-carrying and thus the reversed generation of the magnetic field that acts on the layer system 3, when a current pulse 23 is passed via the logical input 9, as illustrated in FIG. 3.

The connecting interconnects at the circuit layout according to FIG. 3, which connect the inputs and the outputs to one another, run in different planes, this being necessary for insulation reasons. The routing of an interconnect from one plane into the other is effected via contact holes which are present at the respective terminal points and are represented by the small circles in the respective figure. Instead of the input connecting interconnects being relaid in the manner shown in FIG. 3, the configuration may also be reversed and the output connecting interconnects may be routed in a loop and the input connecting interconnects then again run directly between the mutually opposite terminal points.

Figure 4:
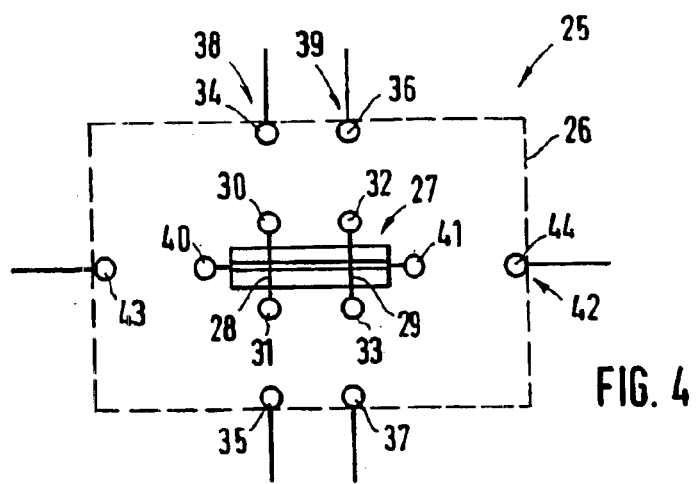
FIG. 4 shows a standard cell as a single cell of a second embodiment with two inputs.

FIG. 4 shows a second embodiment of a standard cell arrangement 25 according to the invention. This standard cell arrangement likewise has a rectangular basic form 26, represented by the dashed line, and a magnetoresistive layer system 27 is provided in the cell center. In the case of this layout, said layer system is assigned two interconnects 28, 29 with respective system input terminals 30, 31 and 32, 33, which are assigned directly opposite input terminals 34, 35 and 36, 37, respectively, which are provided at the cell periphery and altogether form two inputs 38, 39. It is thus possible to apply two separate current pulses and thus input signals to the layer system or to generate corresponding magnetic fields, with the result that logic gates can be constructed with this configuration.

Furthermore, two system output terminals 40, 41 are provided, which are assigned peripheral output terminals 43, 44 forming an output 42.

It should already be pointed out at this juncture that there is no restriction with regard to the number of inputs. Furthermore, it is not absolutely necessary to provide only one magnetoresistive layer system; it is also possible to use a series circuit of programmable layer systems. The only requirement is to strive for integer multiples of a basic area in a standard cell layout. This will be discussed with reference to FIG. 9. The inputs and outputs are accessible in both directions. The current directions are programmed via the periphery, which is correspondingly contact-connected to supply leads.

Figure 5:
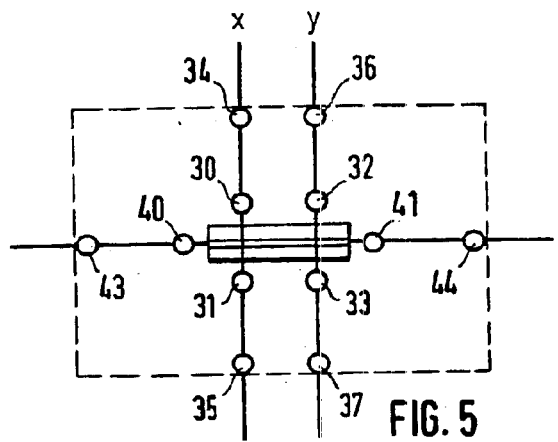
FIG. 5 shows a circuit layout of the standard cell arrangement from FIG. 4 of a first embodiment.

A first embodiment of a circuit layout of this standard cell arrangement from 4 is shown in FIG. 5, where the input and system input terminals and also the output and system output terminals are directly connected to one another, that is to say that the connecting lines of the tracks are as short as possible here. The programming currents by means of which the magnetization of the magnetoresistive layer system is set or altered flow here from the system input terminal 30 to the system input terminal 31, and from the system input terminal 32 to the system input terminal 33.

Figure 6:
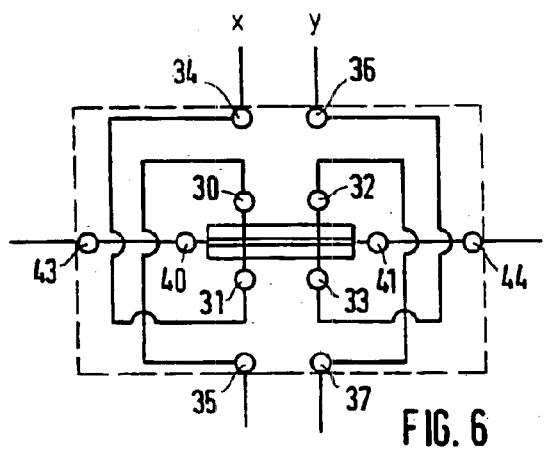
FIG. 6 shows a circuit layout of the standard cell from FIG. 4 of a second embodiment.

The circuitry is different in accordance with FIG. 6, where the input terminals 34 and 35 are connected to one another via a first conductor loop and the input terminals 36 and 37 are connected to one another via a second connecting conductor loop. Here, the programming currents or the input signals are passed from the system input terminal 31 to the system input terminal 30 and from the system input terminal 33 to the system input terminal 32, that is to say in the reverse direction relative to that described with reference to FIG. 5.

Figure 7:
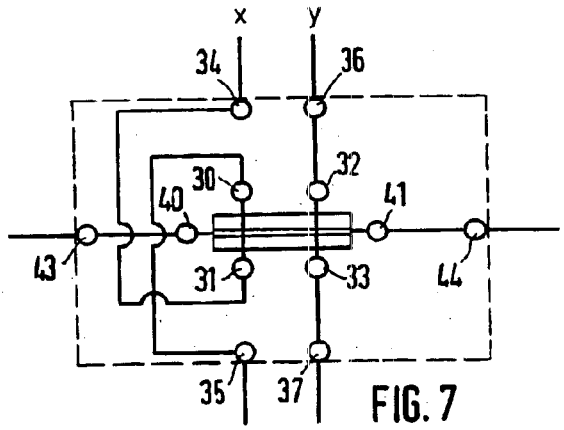
FIG. 7 shows a circuit layout of the standard cell arrangement from FIG. 4 of a third embodiment.

A further embodiment of a circuit layout is shown in FIG. 7, where the input terminals 34 and 35 are connected to one another via a conductor loop, the programming current or the input signal being passed from the system input terminal 31 to the system input terminal 30. The other two input terminals 36 and 37 are connected to one another directly, that is to say as it were rectilinearly, and the current via the layer system is passed in the reverse direction via the two system input terminals 32, 33.

Figure 8:
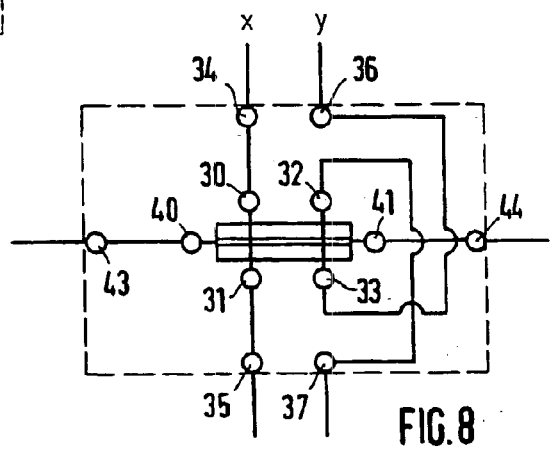
FIG. 8 shows a circuit layout of the standard cell arrangement from FIG. 4 of a fourth embodiment.

Another circuit layout, which corresponds in mirrored fashion to that from FIG. 7, is shown in FIG. 8. In the case of this circuit layout, the inversion loop is laid between the input terminals 36 and 37 (in the case of the embodiment from FIG. 7, the inversion loop lies between the input terminals 34 and 35), and the direct connection is effected between the input terminals 34 and 35 (in comparison with the direct connection between the input terminals 36 and 37 in the case of the circuit layout according to FIG. 7). The inversion functionality is thus available to the right-hand input terminal 36 in the case of this embodiment.

It goes without saying that the respective connecting interconnects are occasionally routed in different planes. It is occasionally necessary, depending on the layout and interconnect routing, that an interconnect does not change plane at a terminal point, but rather, if appropriate, at an arbitrary point on its length. This is done, as already described, by means of a corresponding contact hole, which is envisaged at this point but is not shown, for the sake of clarity. This does not need to be discussed in any further detail since it is obvious to the person skilled in the art how to assign the planes in a concrete manner.

The magnetoresistive layer system 27 may be designed or programmed either as an OR gate or as an AND gate. In the case of an OR gate, the switching of the soft-magnetic layer of the magnetoresistive layer construction requires that a logic '1' is present at least at one of the two inputs or input terminals 30, 32 of the magnetoresistive layer system. The field thereby generated is sufficient to rotate the magnetization. In the case of an AND gate, it is necessary that a logic '1' is present at both terminals simultaneously in order to rotate the magnetization.

Assuming that a positive current (from the system input terminal 30 to the system input terminal 31 or system input terminal 32 to the system input terminal 33) corresponds to the state logic '1', the following possibilities result for a magnetic logic with an OR gate standard cell, in which case, for the sake of simplicity, the two peripheral input terminals 34, 36 are designated by x and y and the respective logic states which are applied to the magnetoresistive layer system on account of the energization and line routing via the respective interconnects 28, 29 are likewise distinguished correspondingly according to x and y:

TABLE 1

| External circuitry | | | | Layout variant | | | | | | | Magnetism | | |
|---|---|---|---|---|---|---|---|---|---|---|---|---|---|
| Input | | FIG. 5 | | FIG. 6 | | FIG. 7 | | FIG. 8 | | | | | |
| x | y | x | y | x | y | x | y | x | y | FIG. 5 | FIG. 6 | FIG. 7 | FIG. 8 |
| 0 | 0 | 0 | 0 | 1 | 1 | 1 | 0 | 0 | 1 | 0 | 1 | 1 | 1 |
| 0 | 1 | 0 | 1 | 1 | 0 | 1 | 1 | 0 | 0 | 1 | 1 | 1 | 0 |
| 1 | 0 | 1 | 0 | 0 | 1 | 0 | 0 | 1 | 1 | 1 | 1 | 0 | 1 |
| 1 | 1 | 1 | 1 | 0 | 0 | 0 | 1 | 1 | 0 | 1 | 0 | 1 | 1 |
| | | | | | | | | | | OR | NOR | /x+y | x+/y |

The table shows firstly the column "external circuitry", which gives the logic states present at the inputs x and y.

The various "layout variants" in accordance with FIGS. 5–8 are presented in the center, a distinction being made here, too, between the logic states on account of the signals x and y as are then present at the magnetoresistive layer system.

Finally, the right-hand column shows the "magnetism" or the logic states at the output terminal for the respective layout variants.

As described, the magnetoresistive layer system may also be expanded as an AND gate. In this case, two logic "1" are necessary in order to rotate the magnetization of the soft-magnetic layer. The corresponding table of values of an AND gate standard cell can be gathered from Table 2 below:

TABLE 2

| External circuitry | | | | Layout variant | | | | | | | Magnetism | | |
|---|---|---|---|---|---|---|---|---|---|---|---|---|---|
| Input | | FIG. 5 | | FIG. 6 | | FIG. 7 | | FIG. 8 | | | | | |
| x | y | x | y | x | y | x | y | x | Y | FIG. 5 | FIG. 6 | FIG. 7 | FIG. 8 |
| 0 | 0 | 0 | 0 | 1 | 1 | 1 | 0 | 0 | 1 | 0 | 1 | 0 | 0 |
| 0 | 1 | 0 | 1 | 1 | 0 | 1 | 1 | 0 | 0 | 0 | 0 | 1 | 0 |
| 1 | 0 | 1 | 0 | 0 | 1 | 0 | 0 | 1 | 1 | 0 | 0 | 0 | 1 |
| 1 | 1 | 1 | 1 | 0 | 0 | 0 | 1 | 1 | 0 | 1 | 0 | 0 | 0 |
| | | | | | | | | | | AND | NAND | /x*y | x*/y |

The programming between AND function and OR function may be effected e.g. by means of different coercive field strengths in the soft-magnetic layers of the respective magnetoresistive layer systems. What proves to be successful here is mask programming, in which it is possible to set shape anisotropies in layers. It holds true in each case that, for an OR function, the coercive field strength of the soft-magnetic layer must be less than the field strength of the magnetic field which is generated upon energization of only one of the interconnects assigned to the layer system. In the case of an AND function, the coercive field strength of the soft-magnetic layer is greater than the field strength of one field but less than the total field strength of both fields, which is generated upon energization of both assigned interconnects.

Figure 9:
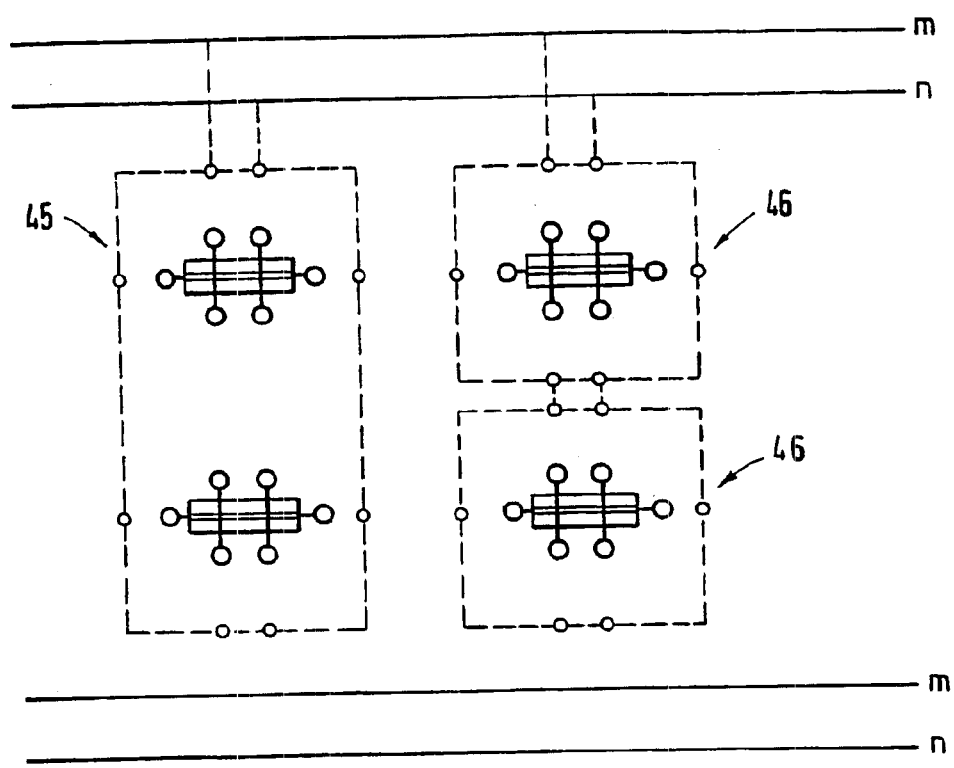
FIG. 9 shows a circuit layout with a total of three standard cell arrangements for illustrating the arrangement on the integrated circuit.

Finally, FIG. 9 shows a detail from an arbitrary integrated logic circuit. The illustration shows two upper supply leads m and n, via which the input signals are provided. Placed between in each case two of such interconnect sections is, in the example shown, a first standard cell arrangement 45, which has a rectangular basic form or basic area which is essentially twice as large as the two "single" standard cell arrangements 46 placed alongside, each of which comprises only one magnetoresistive layer system, while the standard cell arrangement 45 has two magnetoresistive layer systems. On account of the arrangement of the respective peripheral output terminals, the latter are approximately directly opposite one another, which leads to very short wiring paths. Furthermore, the existing space available between the m and n supply leads can be utilized optimally since, as described, the standard cell arrangements describe a minimum area, in the case of a single standard cell arrangement 46, or a multiple of this size, e.g. double the latter in the case of the standard cell arrangement 45. It goes without saying that larger standard cell arrangements are also conceivable, this being dependent on the distance between the m and n lines.

What is claimed is:

1. A standard cell arrangement for a magnetoresistive component, comprising at least one magnetoresistive layer system (3, 27) preferably in the cell center and also at least one input (9, 38, 39) and at least one output (10, 42) at the cell periphery, the input (9, 38, 39) having two input terminals (11, 12, 34, 35, 36, 37), which can be connected to one another for the purpose of carrying a current which generates a magnetic field serving to influence the magnetoresistive layer system (3, 27), the output (10, 42) having two output terminals (13, 14, 43, 44), which can be connected to the magnetoresistive layer system (3, 27) for the purpose of tapping off a signal, and the input and output terminals (11, 12, 34, 35, 36, 37, 13, 14, 43, 44) being arranged at predetermined grid dimension points relative to a rectangular basic form (2, 26) of the cell in each case mirror-symmetrically with respect to one another or centrosymmetrically with respect to the cell center.

2. The standard cell arrangement as claimed in claim 1, characterized in that the two input and two output terminals (9, 38, 39, 13, 14, 43, 44) are arranged in each case at mutually opposite sides.

3. The standard cell arrangement as claimed in claim 1, characterized in that the two input and two output terminals (11, 12, 34, 35, 36, 37, 13, 14, 43, 44) are arranged in each case opposite one another.

4. The standard cell arrangement as claimed in claim 3, characterized in that the two output terminals and/or the two input terminals (11, 12, 34, 35, 36, 37, 13, 14, 43, 44) are arranged in the center of the respective side of the rectangular basic form (2, 26) of the cell.

5. The standard cell arrangement as claimed in claim 3, characterized in that provision is made of two inputs (38, 39) each having two input terminals (34, 35, 36, 37), in each case two input terminals being arranged at a side of the rectangular basic form (26) symmetrically with respect to the respective side center.

6. The standard cell arrangement as claimed in claim 1, characterized in that the magnetoresistive layer system (3, 27) has, corresponding to the number of output terminals (13, 14, 43, 44) provided at the cell periphery, dedicated system output terminals (4, 5, 40, 41) and, corresponding to the number of input terminals (11, 12, 34, 35, 36, 37) provided at the cell periphery, dedicated system input terminals (7, 8, 30, 31, 32, 33), which can be connected to the peripheral output and input terminals via connecting interconnects.

7. The standard cell arrangement as claimed in claim 6, characterized in that the terminals that are in each case to be connected to one another are directly opposite one another.

8. The standard cell arrangement as claimed in claim 1, characterized in that a standard cell arrangement (45) containing a plurality of magnetoresistive layer systems has a rectangular basic form corresponding to a multiple of the area of the rectangular basic form of a standard cell arrangement (46) containing only one magnetoresistive layer system.

9. The standard cell arrangement as claimed in claim 1, characterized in that the construction of the standard cell arrangement is described in the form of program code means which are part of a computer program for creating the layout of an electronic magnetoresistive component.

10. An electronic magnetoresistive component, comprising at least one standard cell arrangement as claimed in claim 1, the peripheral input and output terminals (11, 12, 34, 35, 36, 37, 13, 14, 43, 44) of which are connected to system input and system output terminals (4, 5, 7, 8, 30, 31, 32, 33, 40, 41) on the layer system side via connecting interconnects (15, 16, 17, 18) or a current-carrying connecting means.

11. The electronic magnetoresistive component as claimed in claim 10, characterized in that the connecting interconnects (15, 16, 17, 18) run essentially horizontally and essentially vertically and cross one another at an angle of essentially 90°.

12. The electronic magnetoresistive component as claimed in claim 10, characterized in that the magnetoresistive layer system (3, 27) is an OR gate, an AND gate, a NOR gate or a NAND gate.

13. The electronic magnetoresistive component as claimed in claim 10, characterized in that the layer system (3, 27) is of the GMR (giant magnetoresistive), TMR (tunnel magnetoresistive) or AMR (anisotropy magnetoresistive), or CMR (colossal magnetoresistive) type.

14. The standard cell arrangement as claimed in claim 2, characterized in that the two input and two output terminals (11, 12, 34, 35, 36, 37, 13, 14, 43, 44) are arranged in each case opposite one another.

15. The standard cell arrangement as claimed in claim 4, characterized in that provision is made of two inputs (38, 39) each having two input terminals (34, 35, 36, 37), in each case two input terminals being arranged at a side of the rectangular basic form (26) symmetrically with respect to the respective side center.

16. The electronic magnetoresistive component as claimed in claim 11, characterized in that the magnetoresistive layer system (3, 27) is an OR gate, an AND gate, a NOR gate or a NAND gate.

* * * * *